US008981755B2

(12) United States Patent
Beekmann et al.

(10) Patent No.: US 8,981,755 B2
(45) Date of Patent: Mar. 17, 2015

(54) METHOD AND DEVICE FOR MONITORING THE STATE OF A NETWORK

(75) Inventors: Alfred Beekmann, Wiesmoor (DE); Volker Diedrichs, Wardenburg (DE)

(73) Assignee: Aloys Wobben, Aurich (DE)

( * ) Notice: Subject to any disclaimer, the term of this patent is extended or adjusted under 35 U.S.C. 154(b) by 559 days.

(21) Appl. No.: 13/381,302

(22) PCT Filed: Jun. 23, 2010

(86) PCT No.: PCT/EP2010/058930
§ 371 (c)(1),
(2), (4) Date: Mar. 22, 2012

(87) PCT Pub. No.: WO2011/000754
PCT Pub. Date: Jan. 6, 2011

(65) Prior Publication Data
US 2012/0169059 A1    Jul. 5, 2012

(30) Foreign Application Priority Data

Jun. 29, 2009  (DE) .......................... 10 2009 031 017

(51) Int. Cl.
*G01R 23/16*   (2006.01)
*G01R 23/02*   (2006.01)
(Continued)

(52) U.S. Cl.
CPC ............. *G01R 19/2513* (2013.01); *G01R 23/02* (2013.01); *G01R 25/00* (2013.01); *F03D 9/003* (2013.01); *H02J 3/386* (2013.01); *Y02E 10/72* (2013.01); *Y02E 10/763* (2013.01)
USPC .................... 324/76.12; 324/76.39; 324/86

(58) Field of Classification Search
CPC .... F03D 9/003; G01R 19/2513; G01R 27/27; G01R 27/02; G01R 27/28; G01R 23/00; G01R 23/02; G01R 25/00; G01R 19/0084; G01R 19/0092; G01R 29/16; H02J 3/386; Y02E 10/72; Y02E 10/763
USPC ............ 324/76.12–76.83, 691–724, 86, 107, 324/600, 622, 649, 650, 683, 76.11
See application file for complete search history.

(56) References Cited

U.S. PATENT DOCUMENTS 5,278,773 A * 1/1994 Cousineau .................... 700/287
5,322,067 A * 6/1994 Prater et al. .................... 600/443
(Continued)

FOREIGN PATENT DOCUMENTS

| AU | 460336 B2 | 10/1973 |
| DE | 199 44 680 A1 | 6/2000 |

(Continued)

OTHER PUBLICATIONS

Phadke, et al., "A New Measurement Technique for Tracking Voltage Phasors, Local System Frequency, and Rate of Change of Frequency," *IEEE Transactions on Power Apparatus and Systems*, vol. PAS-102(5):1025-1038, May 1983.

*Primary Examiner* — Hoai-An D Nguyen
(74) *Attorney, Agent, or Firm* — Seed IP Law Group PLLC

(57) ABSTRACT

The present invention concerns a method of detecting electric variables of a three-phase AC network having a first, a second and a third phase, including the steps of measuring a respective voltage value of the first, second and third phases in relation to a neutral conductor at a first moment in time, transforming the three voltage values of the first moment in time into polar co-ordinates with a voltage amplitude and a phase angle, repeating measurement and transformation for at least one further moment in time, and determining the currently prevailing frequency, voltage amplitude and/or phase angle of at least one of the phases from the voltage values transformed into polar co-ordinates.

19 Claims, 3 Drawing Sheets

(51) Int. Cl.
   *G01R 25/00* (2006.01)
   *G01R 19/25* (2006.01)
   *F03D 9/00* (2006.01)
   *H02J 3/38* (2006.01)

(56) References Cited

U.S. PATENT DOCUMENTS

| | | | | |
|---|---|---|---|---|
| 5,502,340 | A * | 3/1996 | Schuster | 307/87 |
| 5,808,462 | A * | 9/1998 | Fujii et al. | 324/76.13 |
| 5,896,033 | A * | 4/1999 | Soderkvist | 324/684 |
| 6,104,102 | A | 8/2000 | Tsuji et al. | |
| 6,230,095 | B1 * | 5/2001 | Wang | 701/110 |
| 6,326,750 | B1 * | 12/2001 | Marcinkiewicz | 318/432 |
| 2004/0243329 | A1 * | 12/2004 | Seki | 702/75 |
| 2005/0151532 | A1 | 7/2005 | Seki | |
| 2007/0279039 | A1 | 12/2007 | Seki | 324/76.52 |
| 2009/0140722 | A1 * | 6/2009 | Mann et al. | 324/120 |
| 2009/0315566 | A1 * | 12/2009 | Thiim | 324/551 |
| 2010/0019758 | A1 * | 1/2010 | Seki | 324/76.39 |

FOREIGN PATENT DOCUMENTS

| | | |
|---|---|---|
| DE | 101 13 786 A1 | 10/2002 |
| EP | 0 004 984 A1 | 10/1979 |
| EP | 1 022 838 A2 | 7/2000 |
| EP | 2 113 776 A1 | 11/2009 |
| EP | 2 124 068 A1 | 11/2009 |
| JP | 7-181207 A | 7/1995 |
| JP | 9-229981 A | 9/1997 |
| JP | 2000-217257 A | 8/2000 |
| JP | 2000-228826 A | 8/2000 |
| JP | 2000-329803 A | 11/2000 |
| JP | 2005-204367 A | 7/2005 |
| WO | WO 2007/011862 A2 | 1/2007 |
| WO | WO 2008/011522 A2 | 1/2008 |
| WO | 2008/114328 A1 | 9/2008 |
| WO | WO 2008/120282 A1 | 10/2008 |

* cited by examiner

METHOD AND DEVICE FOR MONITORING THE STATE OF A NETWORK

BACKGROUND

1. Technical Field

The present invention concerns a method of detecting electric variables of a three-phase AC network having first, second and third phases. The invention further concerns a method of feeding electric energy into an electric AC network. The present invention further concerns a device for detecting electric variables of a three-phase AC network and a device for feeding electric energy into an electric AC network. The invention also concerns a wind power installation which is adapted to detect electric variables of an AC network and/or to feed electric energy into an electric AC network.

2. Description of the Related Art

Particularly to feed electric energy into an existing electric AC network it is necessary to have as accurate knowledge of it as possible. Knowledge of the frequency of the AC voltage in the network and the magnitudes and phases of the voltages are of significance. For other purposes however also, which can be related to the feed into the network, such as for example detecting troubles in the network, detection which is as accurate as possible and in as real-time relationship as possible primarily of the electric voltages of the network is desirable.

To detect frequency and phase angle of the AC voltage of an AC network zero passages of the voltage are usually detected. The time spacing of two adjacent voltage zero passages corresponds to half a period duration, and the frequency can be calculated therefrom. Thus it is also possible to determine the phase position from the zero passage and the frequency or the two zero passages.

A disadvantage in that respect is in particular that at least the time duration of half a period is correspondingly necessary in order to detect frequency and thus changes in frequency. At the same time the quality with such measurement methods may be inadequate. Particularly for AC networks which are increasingly fed and also supported by decentral energy supply means, measurement which is as quick as possible with the highest possible quality is of significance. Reliable and rapid detection of network troubles such as the occurrence of short circuits is also increasingly gaining in significance.

Therefore the object of the invention was to propose a method which is improved in respect of at least one of the aforementioned disadvantages and a corresponding device. In particular the invention seeks to propose a measurement method which is improved as much as possible in respect of speed and quality. At the least an alternative measurement method and an alternative method of feeding energy and corresponding devices were to be proposed.

As state of the art attention is directed at this juncture generally to the following documents: DE 101 13 786 A1, EP 004 984 A1 and DE 199 44 680 A1.

BRIEF SUMMARY

According to the invention there is proposed a method of detecting electric variables of a three-phase AC network in accordance with claim 1.

The basic starting point is a three-phase AC network having first, second and third phases. Hereinafter the reference to a phase angle relates basically to the first phase unless otherwise specified. Indices of 1 to 3, in particular in respect of voltages or phase angles, basically relate to the first, second or third phase respectively.

In a method step a respective voltage value, namely a phase voltage, is detected or measured at a first moment in time of the first, second and third phases, that is to say the voltage in relation to the neutral conductor or another neutral potential.

The next step involves converting of the voltage values measured at the first moment in time in polar co-ordinates into a complex-value variable, whereby a magnitude and a phase angle are correspondingly produced. The words "converting," "transforming," "transformation," and variations of them, refer to changing the representation of the measured voltage values from one form to another form and are considered synonymous as used herein and in the claims.

In that respect the phase angle refers to the first voltage. Transformation can be carried out as follows:

$$\vec{v} = \left[ v_1 + v_2 \exp\left(j\frac{2}{3}\pi\right) + v_3 \exp\left(j\frac{4}{3}\pi\right) \right]$$

$$V_N = \sqrt{\frac{2}{3}} \sqrt{(\text{real}(\vec{v}))^2 + (\text{imag}(\vec{v}))^2}$$

$$\varphi_M = \arctan(\text{imag}(\vec{v})/\text{real}(\vec{v}))$$

In a next step, measurement and transformation are repeated for at least one further moment in time. Thus there is a voltage measurement converted, namely, transformed into polar co-ordinates at least two moments in time. The frequency, voltage amplitude and/or phase angle of at least one of the phases are then determined from those values in polar co-ordinates.

Usually the method may be digitally implemented. In that case the described method steps take place at least partially in temporal succession. In particular at a first moment in time the voltage of the three phases is measured, a transformation operation is carried out and then at a second subsequent moment in time the voltages of the three phases are measured again. Basically however an analog implementation can also be considered, in which case substantially continuous measurement could be performed.

Preferably the currently prevailing frequency, a voltage amplitude and the phases of the three voltages are calculated. Also preferably the moments in time of the measurement operation are spaced apart by less than half a period—based on the expected frequency.

Preferably frequency regulation is used to determine the one effective frequency of the three AC voltages, such frequency regulation expressly not operating in accordance with the concept of the phase-locked-loop (PLL) and regulating out a first auxiliary frequency. A regulating circuit is used for that purpose. The first auxiliary frequency is basically a state variable and a result of that regulating circuit which can be further put to use as an intermediate variable. In principle the first auxiliary frequency itself can also be used as an obtained current frequency.

An auxiliary angle can be determined from the auxiliary frequency. A variable for generating the first auxiliary frequency can be produced by comparison of the phase angle which was determined in the co-ordinate transformation operation to the auxiliary phase angle.

Preferably a first difference angle is formed for frequency regulation. That first difference angle occurs as the difference between the phase angle which occurs in the co-ordinate transformation operation and a first auxiliary phase angle which is back by a sampling time. That first difference angle could therefore also be interpreted as a frequency or difference frequency because at any event the difference between a phase angle and a phase angle which is back by a sampling step corresponds to a frequency.

In accordance with this embodiment that first difference angle is multiplied by a first amplification factor and/or added to an initial frequency value of a frequency to obtain the first auxiliary frequency. The first auxiliary phase angle is determined from the first auxiliary frequency. A frequency to be expected, in particular the nominal frequency or correspondingly the nominal angular frequency of the network, can be used as the initial frequency value.

Preferably, to improve frequency determination, it is proposed that a second auxiliary phase angle is determined, with a second auxiliary frequency. Such a second auxiliary frequency—possibly after filtering—can be outputted as a detected current frequency. Preferably such a second auxiliary frequency and second auxiliary phase angle are based on the first auxiliary frequency and the first auxiliary phase angle, in accordance with one of the foregoing embodiments. Preferably the second auxiliary frequency and the second auxiliary phase angle are determined, in particular regulated, based on a predetermined dynamic behavior, in dependence on the first auxiliary frequency and the first auxiliary phase angle.

In an embodiment, starting from the first auxiliary phase angle and the second auxiliary phase angle, it is proposed that a second difference angle be determined. That second difference angle is formed as the difference between the first auxiliary phase angle and the second auxiliary phase angle which is back by a sampling time. In addition the first and second auxiliary frequencies form the basis for this operation and an auxiliary difference frequency is determined therefrom. The auxiliary difference frequency is formed as the difference between the second auxiliary frequency which is back by a sampling time and the first auxiliary frequency.

In addition, an auxiliary angular acceleration is formed from the second difference angle and the auxiliary difference frequency. That auxiliary angular acceleration is representative of a second derivative of the second auxiliary phase angle in respect of time and the second auxiliary phase angle and also the second auxiliary frequency are calculated from that auxiliary angular acceleration.

Preferably the auxiliary angular acceleration is formed as the difference between the second difference angle and the auxiliary difference frequency, wherein the second difference angle and/or the auxiliary difference frequency can be respectively taken into consideration multiplied by an amplification factor.

In particular difference formation with the auxiliary difference frequency, which can also be referred to as mixing of the auxiliary difference frequency with an amplification factor—which basically could also be 1—has a damping effect on the dynamics of the second auxiliary frequency, according to the respective selection of the amplification factors, insofar as the method steps or features can be interpreted in respect of their effect.

In a preferred embodiment the voltage amplitude obtained upon transformation is outputted as a detected output voltage. In addition or alternatively, in accordance with this embodiment, the phase angle obtained in the transformation operation is differentiated in respect of time—which can be effected discretely or continuously—and outputted as a detected frequency. Alternatively that differentiated phase angle can also be outputted as a detected comparison frequency when in particular a further variable is outputted as a detected frequency.

Additionally or alternatively the second auxiliary frequency is outputted as a detected frequency and additionally or alternatively the second auxiliary phase angle is outputted as a detected phase angle of a phase, in particular the first phase. One, a plurality of or all of said variables can be possibly suitably filtered prior to output.

The variables to be outputted, in particular the second auxiliary frequency outputted as a detected frequency and the second auxiliary phase angle outputted as a detected phase angle, thus form a method product of the method. Such an outputted detected frequency and such an outputted detected phase angle are distinguished in particular by rapid detection. In other words, in particular the output of a detected frequency which has a frequency change in respect of the measured AC network in a period of time less than half a period duration already differs therein from a conventional frequency detection procedure by measurement of the voltage zero passages. If desired it will be appreciated that the method according to the invention could also be implemented or effected more slowly.

In addition in accordance with an embodiment the AC network is monitored for the existence of at least one network disturbance. Such network disturbances include:
  the loss of angle stability,
  the occurrence of island network formation ("loss of mains"),
  the occurrence of a three-phase short-circuit, and
  the occurrence of a two-pole short-circuit.

The occurrence of a three-phase short-circuit can be detected in particular at the collapse of the three phase voltages and thus the collapse of the transformed voltage amplitude. In the case of a two-pole short-circuit basically only one voltage collapses when measurement was made on the d-side of a DY-transformer (delta-star transformer) and the two-pole short-circuit occurred on the D-side. That can be recognized for example at an oscillating voltage amplitude of the transformed voltage.

Upon the loss of angle stability which is also referred to just as the 'loss of stability' (LOS), differentiation of the phase angle $$\left(\frac{d\varphi}{dt}\right)$$

deviates from the network frequency or the network angular frequency. Rapid angle and frequency detection is desirable to detect such a loss of stability.

Upon the occurrence of island network formation which is also referred to as 'loss of mains' (LOM) the actual frequency gradually moves out of the region of the nominal frequency and in particular departs from a predetermined tolerance range. Thus it is to be assumed that the network portion in which measurement is made has lost contact with a larger main network with a more stable frequency.

To indicate the occurrence of a network disturbance a suitable signal can be provided. Such a signal can be produced within a processor unit or outputted as an output signal. At any event such a signal is to be viewed as a product of the method. In particular rapid specifically directed detection of at least one of said network disturbances is an aim that is sought to be achieved and distinguishes such a signal.

In particular in relation to the loss of stability and loss of mains it was recognized according to the invention that these are increasingly to be expected in the case of networks with decentrally feeding-in energy suppliers. In that respect rapid reliable recognition is of significance in order to be able to possibly intervene quickly and in specifically targeted fashion.

Preferably measurement or detection of the electric variables is monitored in relation to a network disturbance in order to recognize any network disturbance. Upon the occurrence of a network disturbance detection is continued in the sense of an estimation based on variables which were last used. It is only possible to refer to actual detection insofar as it is assumed that there is a basically steady continuation of the electric variables of the AC network. In that respect it is proposed, based on last-detected, in particular internal variables of the method, that detection be continued entirely or partially without having regard to input measurement variables. In that respect at least an estimate of the desired variables is effected, wherein no or only partial adaptation of the estimated variables is effected in dependence on measurement variables.

According to the invention or according to an embodiment it is further proposed that electric variables of the electric AC network are measured, in particular using a method as described hereinbefore, and based thereon electric alternating current is fed into the AC network, preferably in three-phase relationship. In that case the AC network is monitored for the existence of at least the network disturbance of the loss of stability and/or the network disturbance of the occurrence of loss of mains. In dependence on the monitoring procedure, if therefore at least one of said network disturbances occurs, measures are initiated to support the AC network. In principle it will be appreciated that consideration is also given to interrupting the feed into the network, depending on the respective network disturbance involved, and separating the energy supplier in question from the network.

Preferably, in addition to monitoring the loss of stability and/or the occurrence of a loss of mains, the occurrence of a three-phase short-circuit and/or the occurrence of a two-pole short-circuit is monitored and measures are initiated to support the AC network if at least one of said network disturbances occurs.

A further configuration proposes that the method of feeding in electric energy is used as a method according to the invention, in particular for determining frequency and phase of the network as a basis for the feed into the network, and also for recognizing any network disturbances in order to be able to initiate suitable measures quickly and in specifically targeted fashion.

The feed into the electric AC network can then be effected in known manner such as for example using a three-phase inverter which, based on a DC voltage intermediate circuit, produces the three phases by a suitable pulse pattern by means of semiconductor switches. The respectively required information in respect of frequency and phase can be provided in that case by the method according to the invention.

When monitoring the network disturbances, preferably as from the occurrence of the network disturbance in question, that network disturbance is detected within a detection time of less than a network period, in particular within a detection time of less than half a network period. It is also proposed that measures for network support be initiated as from the occurrence of a network disturbance within a reaction time of less than a network period, in particular within a reaction time of less than half a network period. To correspondingly rapidly detect network disturbances in order to detect the network disturbance in the specified short time and also to initiate support measures in the specified short time, there is proposed a method according to the invention as described hereinbefore which for detection purposes is not limited to the measurement of voltage zero passages but rather can effect measurement independently of the voltage zero passages and a plurality of times between voltage zero passages and can deliver correspondingly fast results.

In addition there is proposed a measuring device for detecting electric variables of a three-phase electric AC network which substantially implements a measuring method according to the invention. For that purpose at least one measuring means is used for measuring the electric instantaneous voltage of each of the three phases with respect to a neutral conductor, that is to say for measuring the phase voltages. In addition there is provided a computing unit for determining the frequency and phase of the electric network. The measuring means supply, in particular digitally, the measured voltages to the computing unit at each sampling time. The computing steps of the respective embodiment of the measuring method according to the invention are implemented on the computing unit. In particular the computing steps are to be implemented on a digital signal processor although theoretically implementation could also be considered by means of an analog computer or an analog circuit.

In addition there is proposed a feed-in device for feeding electric energy into an AC network. For that purpose the feed-in device has at least a measuring device and a feed-in unit. The measuring device which in particular is of a design and construction in accordance with the above-described embodiment detects in particular frequency and phase of the electric AC network. Those variables form the basis for the feed of energy into the network and are to be provided in particular for synchronization but also for recognizing disturbances. A feed-in unit is used for feeding in the energy, wherein the feed-in device is controlled in accordance with a feed-in method as described hereinbefore. In particular a feed-in unit can include a frequency inverter for converting electric energy from a DC intermediate circuit by means of suitable semiconductor switches into a sinusoidal configuration for each phase by way of a pulse method.

In addition there is proposed a wind power installation which in particular takes kinetic energy from the wind and converts it into electric energy by means of a generator. The electric energy is fed into a three-phase AC network. A feed-in device as described hereinbefore is used for feeding in the energy. To detect the electric variables, in particular frequency and phases of the three-phase AC network, a measuring device as described hereinbefore is employed. These and other detected electric variables of the AC network can serve as a basis for the feed-in device.

It is to be noted in principle that the measuring device can be part of the feed-in device.

BRIEF DESCRIPTION OF THE SEVERAL VIEWS OF THE DRAWINGS

The invention is described in greater detail hereinafter by way of example by means of embodiments with reference to the accompanying Figures.

DETAILED DESCRIPTION

Figure 1:
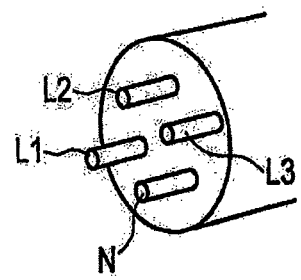
FIG. 1 diagrammatically shows a connection point of a three-phase network with neutral conductor.

The invention is based on a three-phase connection point 2 which has three lines L1, L2 and L3 for carrying a respective phase and a neutral conductor N, as shown in FIG. 1. The connection point 2 is symbolically indicated as the end of a cable for illustrative purposes. Equally the three phases L1, L2 and L3 and the neutral conductor N can be provided for example in a connection box.

Figure 2:
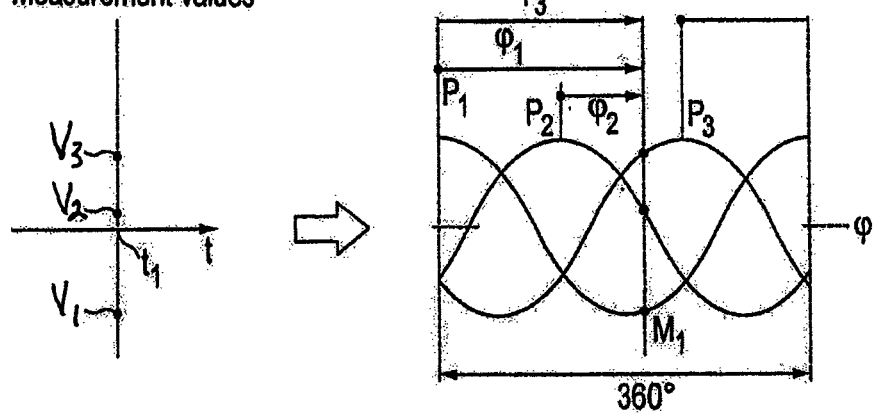
FIG. 2 shows the measurement values of a three-phase system in relation to a portion of the voltage configurations of the three-phase system for the duration of a period length.

FIG. 2 shows the kind of measurement on which the invention is based in principle. In accordance therewith a voltage is measured in relation to the neutral conductor N at a moment in time $t_1$ at each of the lines L1, L2 and L3. Those measurement values $v_1$, $v_2$ and $v_3$ can basically be associated with a position in a 360° portion, namely a period duration. In that respect FIG. 2 shows such a portion of a period duration for all three phases P1, P2 and P3. The corresponding position of the measurement at the moment in time $t_1$ is associated with the position M1 in the portion of a period duration which is plotted over an angle φ. The phase angles $\phi_1$, $\phi_2$ and $\phi_3$ thus concern the angle from the voltage maximum—the peak value—of the respective phase to the measurement position M1. The respective phases are characterized as P1, P2 and P3. The phase angle $\phi_3$ belongs to the phase P3. The peak value of the phase P3 is after the position M1 and is thus indicated by an arrow which basically begins at the apex point of P3 and is to be measured off until the end of the illustrated period plus the value from the start of the period to the measurement position M1. In the case of a symmetrical network the phase angles $\phi_1$, $\phi_2$ and $\phi_3$ would be respectively displaced relative to each other by 120° or 240°.

The absolute amplitude of the phases P1, P2 and P3 is not important in regard to the illustration in FIG. 2. The amplitude can be standardized for example for that illustration. The period duration in accordance with the illustration in FIG. 2 is 360° or 2π.

Figure 3:
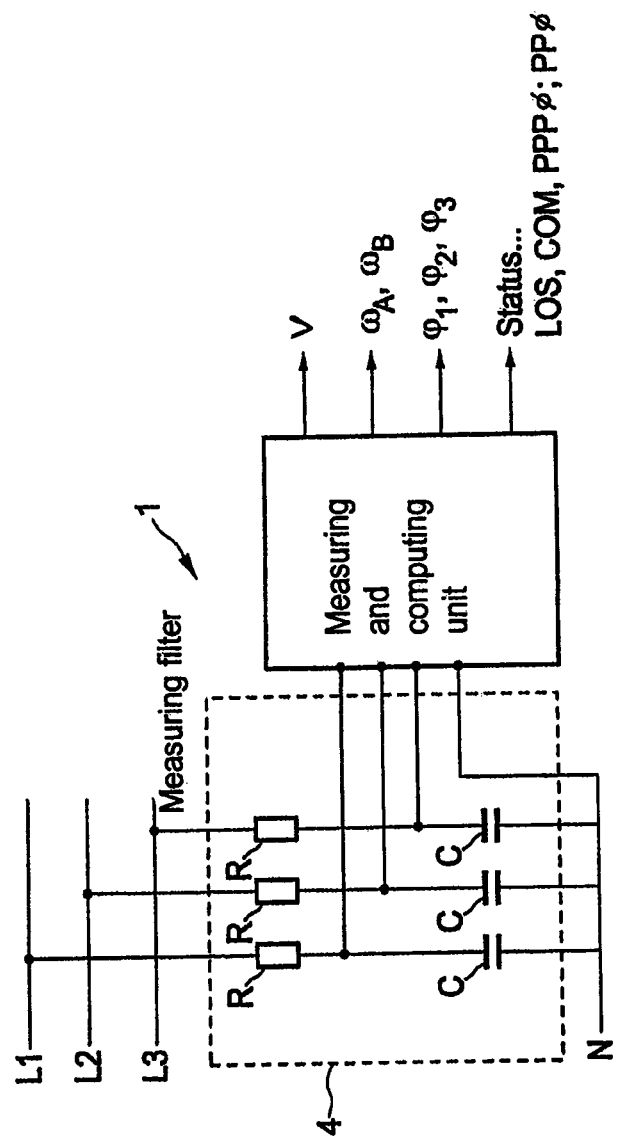
FIG. 3 shows the basic structural configuration of a three-phase AC network with connected measuring device.

FIG. 3 shows an overall structure of a three-phase network with neutral conductor and connected measuring device 1 in accordance with an embodiment of the invention. For the measurement procedure the measuring device 1 uses a measuring filter 4 which for that purpose is connected between the lines L1, L2 and L3 and the neutral conductor. The lines L1, L2 and L3 correspondingly carry the first, second and third phases respectively. In that case an RC member is connected between the respective line L1, L2 and L3 respectively and the neutral conductor N for measuring the phase voltage. The voltage which is thus respectively measured between the resistor R and the capacitor C in relation to the neutral conductor N is inputted into the measuring device 1 and is there further processed and evaluated.

In that case the measuring device 1 outputs the following variables as output variables or for further processing in a control unit, in particular a feed-in unit:
- an estimate for the effective value V of the AC voltages,
- estimates for the frequency of the AC voltages (angular frequencies) $\omega_A$, $\omega_B$,
- the angles $\phi_1$, $\phi_2$ and $\phi_3$ at the moment of voltage measurement as voltages $v_1$, $v_2$ and $v_3$ measured from the measurement values of the voltage between the lines L1, L2 and L3 and the neutral conductor N,
- items of status information or status flags relating to possible network disturbances of the loss of stability (LOS), the occurrence of loss of mains (LOM), the occurrence of a three-phase short-circuit PPPØ (referred to as phase-phase-phase ground) and the occurrence of a two-pole short-circuit PPØ (referred to as phase-phase ground).

Figure 4:
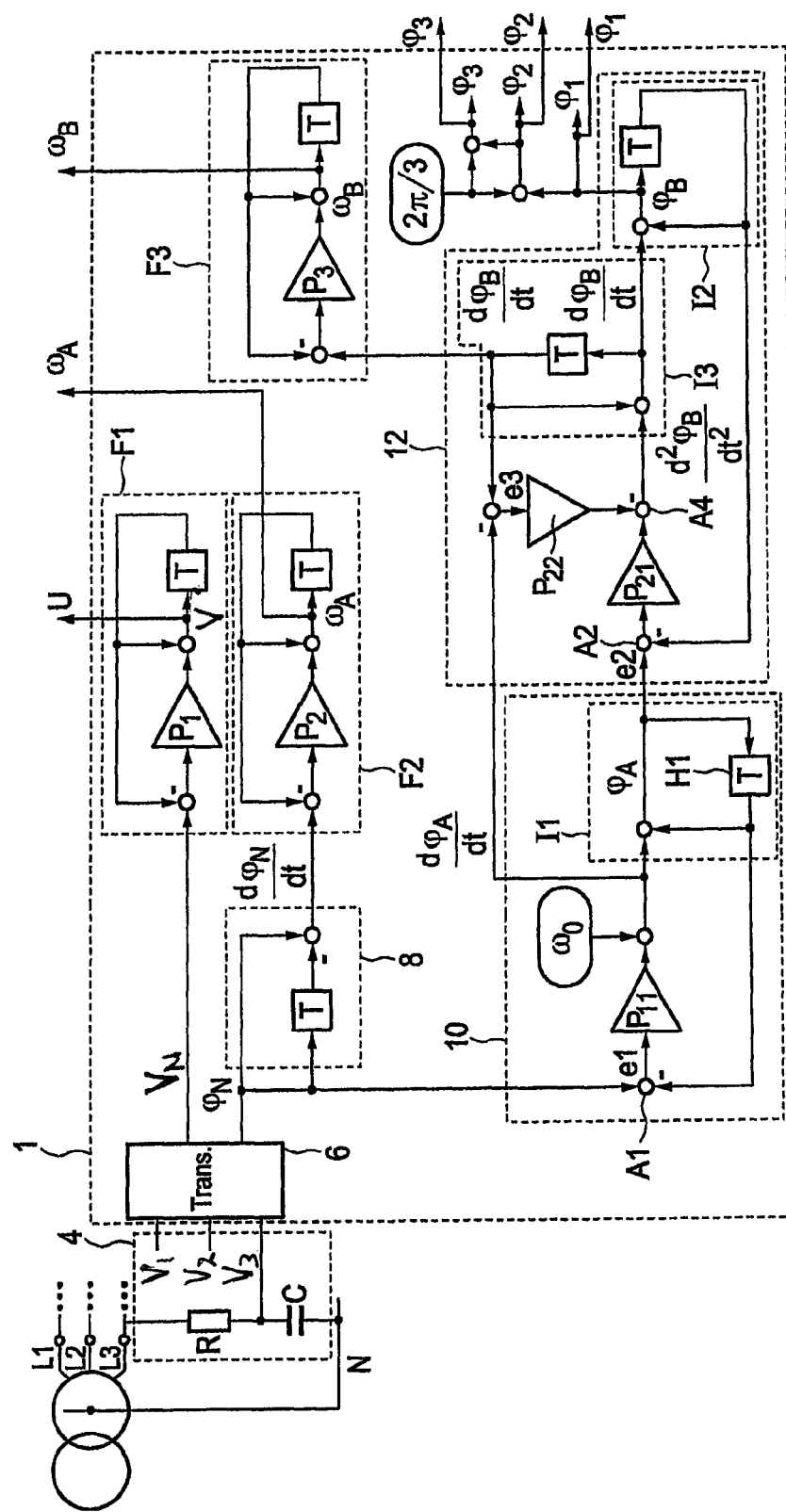
FIG. 4 shows the structure of the method according to the invention in accordance with an embodiment.

FIG. 4 shows the internal structure of the measuring device 1 which can also be referred to as the measuring and computing unit 1. The illustrated structure is basically in the form of a time-discrete structure. Nonetheless for the sake of enhanced clarity for explanatory purposes reference is directed in part to time-continuous representations, in particular time derivatives. In principle both time-discrete and also time-continuous implementation is possible.

The phase voltages $v_1$, $v_2$ and $v_3$ are continuously measured and inputted into the measuring and computing unit or are applied there. FIG. 4 shows the measuring filter 4 only insofar as an RC member is designed only for one phase. In actual fact the structure of the measuring filter 4 corresponds to that shown in FIG. 3.

The respective voltage measurement values $v_1$, $v_2$ and $v_3$ are inputted into the transformation block 6. In the case of a digital signal processor sampling and holding of the respective measurement values are effected there. Transformation of the three voltage values $v_1$, $v_2$ and $v_3$ into polar co-ordinates is effected in the transformation block 6. Transformation is performed in accordance with the following equations:

$$\vec{v} = \left[v_1 + v_2\exp\left(j\frac{2}{3}\pi\right) + v_3\exp\left(j\frac{4}{3}\pi\right)\right]$$

$$V_N = \sqrt{\frac{2}{3}}\sqrt{(\text{real}(\vec{v}))^2 + (imag(\vec{v}))^2}$$

$$\varphi_M - \arctan(imag(\vec{v})/\text{real}(\vec{v}))$$

The voltage $V_N$ and the angle $\phi_N$ are outputted from the transformation block 6 as an intermediate result for further processing and computation.

The voltage $V_N$ is applied to a first digital filter F1 which has a holding member T and a first amplification factor $P_1$. The digital filter also has two summing locations which are each illustrated by a circular symbol. Insofar as a minus sign is shown as the sign, the value of the signal path in question is deducted. Otherwise addition is effected, which moreover also applies for the further adding members shown in FIG. 4.

The basic mode of operation of such a digital filter F1 is basically known to the man skilled in the art and it is therefore not further discussed here. Therefore the voltage $V_N$ is filtered in the first digital filter F1 and the voltage V is outputted as an estimate of the effective value V of the AC voltages.

The phase angle $\phi_N$ is time-discretely differentiated in a differentiating member 8 and thus corresponds to an angular frequency which is shown in FIG. 4 as $d\phi_N/dt$. That angle frequency or angular frequency is applied to a second digital filter F2 which corresponds in structure to the first digital filter F1 and which has a second amplification factor P2. As a result this affords an estimate of the frequency of the AC voltage $\omega_A$ which is correspondingly outputted as an estimate of the frequency of the AC voltage $\omega_A$.

The phase angle $\phi_N$ is also inputted into a frequency regulating circuit 10. A first auxiliary frequency $d\phi_A/dt$ is determined in the frequency regulating circuit 10 and adjusted in the sense of regulation of the network frequency or network angular frequency insofar as the frequency regulating circuit 10 can be substantially interpreted. In the first frequency regulating circuit 10 there is a first time-discrete integration member I1 which determines a first auxiliary angle $\phi_A$ from the first auxiliary frequency $d\phi_A/dt$. The first half-angle $\phi_A$ which is back by a sampling period is deducted from the current phase angle $\phi_N$ at the first addition location A1. That affords a first difference input variable e1 which is basically a difference frequency. That first difference input variable e1 can be interpreted in the broad sense as a regulating error or regulating deviation of the frequency regulating circuit 10 insofar as an interpretation is at all possible. At any event that first difference input variable e1 is multiplied by a regulating amplification P11 and added to the nominal frequency $\omega 0$ to determine the first auxiliary frequency $d\phi_A/dt$.

In principle it is also to be noted that a digital integration member, like the digital integration member I1, for the integration of a frequency in relation to an angle with an assumed positive frequency, leads to a continuously rising angle which basically tends towards infinity. It will be appreciated that basically the value of an angle between 0° and 360° or 0 and $2\pi$ is of interest and upon implementation resetting by the value 360 can be effected each time that the value exceeds the value of 360° or falls below 0, which is not discussed in detail here.

Although the frequency regulating circuit 10 can be viewed as a P-regulator by virtue of the regulating amplification P11, nonetheless it is possible to achieve steady accuracy without a regulating deviation for the first auxiliary frequency $d\phi_A/dt$, which is due to the first integrating member I1 in the integral performance when determining the first auxiliary angle $\phi_A$.

The first auxiliary frequency $d\phi_A/dt$ could be used as an estimate of the frequency of the AC voltage and correspondingly outputted by the measuring device 1. In the embodiment shown in FIG. 4 however there is a further processing operation and in particular an improvement.

In a second regulating circuit 12 a second auxiliary frequency $d\phi_B/dt$ is determined. The second auxiliary angle $\phi_B$ is determined by means of a second integrating member I2. At the second adding location A2 the second auxiliary angle $\phi_B$ delayed by a sampling time or period is deducted from the first auxiliary angle $\phi_A$ and that gives a second difference input variable e2. That second difference input variable is basically a difference frequency. It can be interpreted in the broad sense as a regulating error in order to regulate out the second auxiliary frequency $d\phi_B/dt$ to the first auxiliary frequency or to adjust same.

It is to be noted that the interpretations as regulation are intended to serve as illustrative explanation. Classic regulation in the sense of a reference value-actual value comparison does not occur in that respect. Rather the situation involves improving estimated values in respect of their values or also their dynamics.

At any event the second difference input variable e2 is passed by way of a second regulating amplification P21 and multiplied therewith. In addition difference formation is effected between the second auxiliary frequency $d\phi_B/dt$ which is back by a sampling time and the current first auxiliary frequency $d\phi_A/dt$ at the third addition location A3. That gives a third difference input variable e3 which basically is a difference angle acceleration. Multiplied by the third regulating amplification P22 it is deducted from the second difference input variable e2 multiplied by the second regulating amplification P21, at the fourth addition location A4. That gives an angle acceleration $$\frac{d^2\varphi_B}{dt^2}.$$

Finally the second auxiliary frequency $d\phi_B/dt$ can be determine by means of a third integrating member I3. It is to be noted that a damping action can be achieved by mixing of the third difference input variable e3 having regard to the third regulating amplification P22 at the fourth adding location A4. The second regulating circuit 12 is thus essentially provided to influence the dynamic behavior of frequency estimation.

Finally the second auxiliary frequency $d\phi_B/dt$ is passed by way of a third digital filter F3 and the estimated value for the frequency of the AC voltage $\omega_B$ is outputted. In addition the second auxiliary angle $\phi_B$ can be outputted directly as an estimated value for the first phase angle $\phi 1$ and the respective estimated value for the second phase angle $\phi 2$ and the third phase angle $\phi 3$ can be ascertained by addition of $2\pi/3$ and $4\pi/3$ (120° and 240°) respectively and outputted.

The method illustrated by means of FIG. 4 can also be specified by the following system of equations:

$$\frac{dV}{dt} = P_1(V_N - V)$$

$$\frac{d\omega_A}{dt} = P_2\left(\frac{d\varphi_N}{dt} - \omega_A\right)$$

$$\frac{d\omega_B}{dt} = P_3\left(\frac{d\varphi_B}{dt} - \omega_B\right)$$

$$\frac{d\varphi_A}{dt} = P_{11}(\varphi_N - \varphi_A) + \omega_O$$

$$\frac{d\varphi_B}{dt} = \omega_B$$

$$\frac{d\omega_B}{dt} = P_{21}(\varphi_A - \varphi_B) + P_{22}\left(\frac{d\varphi_A}{dt} - \frac{d\varphi_B}{dt}\right)$$

$$\varphi_1 = \varphi_A,\ \varphi_2 = \varphi_1 + \frac{2}{3}\pi,\ \varphi_3 = \varphi_2 + \frac{2}{3}\pi$$

The implementation of the measurement at any event in accordance with the embodiment of FIG. 4 means that advantageously—at any event for a transitional period of time—estimated variables can still be supplied in a fault situation. If for example there is an interruption in respect of the measuring device 1 or the measuring filter 4 to the AC network no measurement variables are available for improving the estimate. Rather, it can be assumed that any measurement values which are basically meaningless worsen the estimate or even make it unusable. Such a fault situation can be recognized for example if the phase angle $\phi_N$ suddenly no longer changes or changes abruptly in its value. Equally a sudden collapse of the voltage amplitude $V_N$ can be an indication. In such a case at least the signal connection is to be cut immediately downstream of the regulating amplification P11. It will be appreciated that this can also be effected by the regulating amplification P11 being set to zero. As detection of a fault situation is possibly only effected by monitoring the first auxiliary frequency $d\phi_A/dt$ the first phase angle $\phi_A$ can already be roughly wrong. In that situation, the recommendation is that the value for the first auxiliary phase angle $\phi_A$ is corrected for example in the first holding member H1, for example based on a value which is further back by at least one sampling time. In that respect estimation and in particular the second estimation of the frequency of the AC voltage $\omega_B$ and estimation of the phase angles $\phi_1$, $\phi_2$ and $\phi_3$ can be continued and values which are still usable can be supplied at least for a short period of time of, for example, some network periods. It will be appreciated that further, in particular sudden changes in the frequency and the phase of the AC network can no longer be reliably recognized, without measurement. When the fault situation is terminated further measurement can normally be effected. In particular the signal connection downstream of the regulating amplification P11 can be restored.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method of detecting electric variables of a three-phase AC network having a first, a second and a third phase, including the steps:
measuring a respective voltage value of the first, second and third phases in relation to a neutral conductor at a single first moment in time;
converting the three voltage values of the first moment in time into polar co-ordinates with a voltage amplitude and a phase angle;
repeating measuring and converting steps for at least one further moment in time; and
determining a currently prevailing frequency, voltage amplitude or phase angle of at least one of the phases based on the voltage values converted into polar co-ordinates.

2. The method according to claim 1 wherein frequency regulation which regulates out a first auxiliary frequency is used for detection of the currently prevailing frequency.

3. The method according to claim 2 wherein a first difference angle is formed for frequency regulation between
the phase angle formed in the converting step; and
a first auxiliary phase angle which is delayed by a sampling time,
said first difference angle is multiplied by a first amplification factor and/or added to an initial frequency value to obtain the first auxiliary frequency, and the first auxiliary phase angle is determined from the first auxiliary frequency.

4. The method according to claim 3 wherein a second auxiliary phase angle is determined with a second auxiliary frequency, for improving frequency determination.

5. The method according to claim 4 wherein:
a second difference angle is formed as the difference between the first auxiliary phase angle and the second auxiliary phase angle which is delayed by a sampling time;
an auxiliary difference frequency is formed as the difference between the second auxiliary frequency and the first auxiliary frequency; and
an auxiliary angle acceleration is formed from the first difference angle and the auxiliary difference frequency, wherein the auxiliary angle acceleration is representative of a second derivative of the second auxiliary phase angle in respect of time, wherein the second auxiliary phase angle and the second auxiliary frequency is calculated from the auxiliary angle acceleration.

6. The method according to claim 5 wherein the auxiliary angle acceleration is formed as the difference between
the second difference angle or the second difference angle multiplied by a second amplification factor; and
the auxiliary difference frequency or the auxiliary difference frequency multiplied by a third amplification factor.

7. The method according to claim 4 wherein:
the voltage amplitude obtained in the converting step is outputted as a detected output voltage;
the phase angle obtained in the converting step is differentiated in respect of time and outputted as a detected frequency or a detected comparison frequency;
the second auxiliary frequency is outputted as a detected frequency; and
the second auxiliary phase angle is outputted as a detected phase angle of a phase,
wherein one or more of the variables to be outputted is filtered prior to output.

8. The method according to claim 1 and further including the step of:
monitoring the AC network for the existence of at least one network disturbance from the list:
loss of angle stability;
occurrence of loss of mains;
occurrence of a three-phase short-circuit;
occurrence of a two-pole short-circuit; and
providing a signal for indicating the existence of one of the network disturbances.

9. The method according to claim 8 wherein when the signal indicating the detecting network disturbance is provided, the detecting continues as an estimate based on the electric variables last calculated.

10. The method according to claim 8 wherein detection of the electric variables is affected within a detection time of less than a network period.

11. The method according to claim 8 wherein the detection of the network disturbances is effected from the occurrence of the network disturbance within a time of less than a network period.

12. The method according to claim 8 further including:
initiating measures for network support after the network disturbance within a reaction time of less than a network period.

13. The method according to claim 10 wherein the detection time of the electric variables is effected in less than half a network period.

14. The method according to claim 11 wherein the detection time of the network disturbances is effected in less than half a network period.

15. A method of feeding electric energy into an electric AC network including the steps:
detecting electric variables of the electric AC network, the detecting including:
measuring a respective voltage value of the first, second and third phases in relation to a neutral conductor at a single first moment in time;
converting the three voltage values of the first moment in time into polar co-ordinates with a voltage amplitude and a phase angle;
repeating measuring and converting steps for at least one further moment in time; and determining a currently prevailing frequency, voltage amplitude or phase angle of at least one of the phases based on the voltage values converted into polar co-ordinates;

feeding electric alternating current into the AC network;

monitoring the AC network for the existence of at least one network disturbance from the list:
  loss of angle stability; and
  occurrence of loss of mains; and initiating measures for supporting the AC network if at least one of said network disturbances occurs.

16. A method according to claim 15 wherein in addition the AC network is monitored for the existence of at least one further network disturbance from the list:
  occurrence of a three-phase short-circuit;
  occurrence of a two-pole short-circuit; and
  measures are initiated for supporting the AC network if at least one of said network disturbances occurs.

17. A measuring device for detecting electric variables of a three-phase electric AC network, including at least the frequency and a phase of the AC network, including:
  voltage measuring means for measuring the electric instantaneous voltage of each of the three phases in relation to a neutral conductor; and
  a computing unit for determining at least the frequency and phase of the electric network,
  wherein the measuring device is configured to perform the steps of:
    measuring a respective voltage value of the first, second and third phases in relation to a neutral conductor at a single first moment in time;
    converting the three voltage values of the first moment in time into polar co-ordinates with a voltage amplitude and a phase angle;
    repeating measuring and converting steps for at least one further moment in time; and
    determining a currently prevailing frequency, voltage amplitude or phase angle of at least one of the phases based on the voltage values converted into polar co-ordinates.

18. A feed-in device for feeding electric energy into an AC network including:
  a measuring device, for measuring electric variables of the AC network; and
  a feed-in unit for feeding electric energy into the AC network,
  wherein feeding electric energy into the AC network comprises the following steps:
    detecting electric variables of the electric AC network, the detecting including:
      measuring a respective voltage value of the first, second and third phases in relation to a neutral conductor at a single first moment in time;
      converting the three voltage values of the first moment in time into polar co-ordinates with a voltage amplitude and a phase angle;
      repeating measuring and converting steps for at least one further moment in time; and
      determining a currently prevailing frequency, voltage amplitude or phase angle of at least one of the phases based on the voltage values converted into polar co-ordinates;
    feeding electric alternating current into the AC network;
    monitoring the AC network for the existence of at least one network disturbance from the list:
      loss of angle stability; and
      occurrence of loss of mains; and
    initiating measures for supporting the AC network if at least one of said network disturbances occurs.

19. The feed-in device according to claim 18, wherein the feed-in device is coupled to a wind power installation for converting wind energy into electric energy and for feeding the electric energy into an AC network.

* * * * *

UNITED STATES PATENT AND TRADEMARK OFFICE
CERTIFICATE OF CORRECTION

PATENT NO. : 8,981,755 B2
APPLICATION NO. : 13/381302
DATED : March 17, 2015
INVENTOR(S) : Alfred Beekmann et al.

It is certified that error appears in the above-identified patent and that said Letters Patent is hereby corrected as shown below:

In The Specification

Column 2, Line 25:

" $\varphi_M - \arctan(imag(\vec{v})/real(\vec{v}))$ " should read, -- $\varphi_M = \arctan(imag(\vec{v})/real(\vec{v}))$ --.

Column 8, Line 33:

" $\varphi_M - \arctan(imag(\vec{v})/real(\vec{v}))$ " should read, -- $\varphi_M = \arctan(imag(\vec{v})/real(\vec{v}))$ --.

Signed and Sealed this
Tenth Day of May, 2016

Michelle K. Lee
*Director of the United States Patent and Trademark Office*